(12) United States Patent
Shim

(10) Patent No.: US 9,851,409 B2
(45) Date of Patent: Dec. 26, 2017

(54) ENERGY STORAGE DEVICE CONTROLLING METHOD AND POWER MANAGEMENT SYSTEM

(71) Applicant: LSIS CO., LTD., Anyang-si, Gyeonggi-do (KR)

(72) Inventor: Jae Seong Shim, Seoul (KR)

(73) Assignee: LSIS CO., LTD., Anyang-si (KR)

( * ) Notice: Subject to any disclaimer, the term of this patent is extended or adjusted under 35 U.S.C. 154(b) by 227 days.

(21) Appl. No.: 14/990,733

(22) Filed: Jan. 7, 2016

(65) Prior Publication Data

US 2016/0268802 A1 Sep. 15, 2016

(30) Foreign Application Priority Data

Mar. 10, 2015 (KR) .................. 10-2015-0033378

(51) Int. Cl.
| | |
|---|---|
| *H02J 1/00* | (2006.01) |
| *H02J 3/00* | (2006.01) |
| *G01R 31/36* | (2006.01) |
| *H02J 3/24* | (2006.01) |
| *H02J 3/32* | (2006.01) |

(52) U.S. Cl.
CPC ........... *G01R 31/3606* (2013.01); *H02J 3/24* (2013.01); *H02J 3/32* (2013.01)

(58) Field of Classification Search
USPC ...................................... 307/43, 82; 363/15
See application file for complete search history.

(56) References Cited

U.S. PATENT DOCUMENTS

| | | | | |
|---|---|---|---|---|
| 4,150,546 A | * | 4/1979 | Collett ..................... | G21D 3/14 376/211 |
| 6,429,546 B1 | * | 8/2002 | Ropp ....................... | H02J 3/01 307/31 |
| 6,580,626 B2 | * | 6/2003 | Takegami ............. | H02M 3/285 363/15 |
| 6,757,590 B2 | * | 6/2004 | Ross ....................... | H02J 3/387 429/432 |

(Continued)

FOREIGN PATENT DOCUMENTS

| | | |
|---|---|---|
| JP | 2012-239378 | 12/2012 |
| KR | 10-1998-0070253 | 10/1998 |
| WO | 2014177264 | 11/2014 |

OTHER PUBLICATIONS

Japan Patent Office Application No. 2016-024944, Office Action dated Mar. 21, 2017, 3 pages.

*Primary Examiner* — Adam Houston
(74) *Attorney, Agent, or Firm* — Lee, Hong, Degerman, Kang & Waimey

(57) ABSTRACT

A method for controlling energy storage device includes determining whether the operating frequency of the system falls within a dead band range corresponding to a preset frequency range, determining whether an SOC level indicating the charging amount of the energy storage device falls within a preset maintaining range, in a case where the operating frequency falls within the dead band range, and adjusting the SOC level so that the SOC level falls within the maintaining range in a case where the operating frequency of the system falls within the dead band range and the SOC level is outside the preset maintaining range, wherein the maintaining range represents a range between a preset lower limit and a preset upper limit.

13 Claims, 6 Drawing Sheets

(56) References Cited

U.S. PATENT DOCUMENTS

| | | | | |
|---|---|---|---|---|
| 7,553,568 B2* | 6/2009 | Keefer | ............. | H01M 8/04097 |
| | | | | 429/411 |
| 7,728,456 B2* | 6/2010 | Kusubayashi | ............ | B60L 1/00 |
| | | | | 307/26 |
| 7,839,027 B2 | 11/2010 | Shelton et al. | | |
| 8,436,489 B2* | 5/2013 | Stahlkopf | ............... | F01K 13/02 |
| | | | | 307/43 |
| 8,860,247 B2* | 10/2014 | Yamane | ................. | H02J 9/062 |
| | | | | 307/23 |
| 8,970,176 B2* | 3/2015 | Ballatine | ................ | H02J 1/102 |
| | | | | 307/11 |
| 9,038,387 B2* | 5/2015 | Kaufmann | ............... | F02C 1/05 |
| | | | | 60/641.11 |
| 9,300,141 B2* | 3/2016 | Marhoefer | ............... | H02J 3/32 |
| 9,488,160 B2* | 11/2016 | Fisher | ...................... | F03G 7/04 |
| 9,559,520 B2* | 1/2017 | Shelton | ................... | H02J 3/381 |
| 9,568,931 B2* | 2/2017 | Ye | ............................. | H02J 3/24 |
| 9,715,261 B2* | 7/2017 | Wilkins | ................... | G06F 1/26 |
| 2010/0090532 A1 | 4/2010 | Shelton et al. | | |
| 2012/0323389 A1 | 12/2012 | Shelton et al. | | |
| 2014/0292080 A1 | 10/2014 | Markowz et al. | | |

* cited by examiner

ENERGY STORAGE DEVICE CONTROLLING METHOD AND POWER MANAGEMENT SYSTEM

CROSS-REFERENCE TO RELATED APPLICATIONS

Pursuant to 35 U.S.C. §119(a), this application claims the benefit of earlier filing date and right of priority to Korean Patent Application No. 10-2015-0033378, filed on Mar. 10, 2015, the contents of which are all hereby incorporated by reference herein in its entirety.

BACKGROUND

The present disclosure relates to provision of an ancillary service for a power system, and particularly, to integrated energy storage using an electricity storage system and a frequency regulation technique.

For a certain given time, for example, for one day, an electric system operator estimates the amount of required energy per second, minute or hour.

An electricity provider supplies energy by as much as the estimated amount through a power plant. In general, an average actual load approximates to the estimated amount. However, the amount of required energy may change rapidly, and, if the amount of required energy becomes larger or smaller than expected, an actual load increases due to the rapid change in the energy amount.

To prepare for such a change, the electricity provider may change an electricity output from the power plant to meet a required load. Changing of the output from the power plant may be referred to as "load following". In the case where a load is larger than transferred power, it would be obvious that the transferred power should be increased so as to maintain operation of electric devices.

FIG. 1 is a diagram illustrating an actual load 110 and load following 120 of a power plant. As shown, it is difficult for the power plant to accurately match a change in the actual load. In the case where supplied power differs from a power load, a frequency of AC current supplied to a home or a factory may not be 50 Hz or 60 Hz which may be referred to as a reference value. Such a frequency difference may cause inefficient operation of an electronic device such as a home appliance, a lighting device, or the like, and may even cause unsafe operation.

In order to maintain a required operating frequency of AC current, a power system operator should make the power plant perform an additional operation, i.e., frequency regulation. Referring to FIG. 1, reference numeral 130 represents how frequently the frequency regulation should be performed for each moment in order to maintain a frequency within a desired operating range.

When a (required amount of) load is smaller than supplied power, an output frequency increases to 60 Hz or higher. On the contrary, when the load is larger than the supplied power, the frequency decreases since an energy generation amount of a power plant decreases.

The idea of providing a fast-response power plant synchronized with a frequency of a system or a fast-response power plant capable of quickly starting to supply energy in response to a failure event or other problems pertaining to power supply may be conceived of. However, it is currently difficult to configure such a power plant.

In general, services such as a synchronous storage and frequency regulation are classified as ancillary services for a power system. Such services should satisfy the requirements of energy for power provision and consumption.

The frequency regulation, synchronous storage, and other ancillary services are provided by a power plant. However, an energy storage technology such as a battery, a flywheel, a capacitor, or the like may be used to supply energy to an electric power system. Furthermore, according to such energy storage technologies, surplus energy of the system may be stored for later use or may be discharged from the system.

Since the frequency regulation should be performed to increase or decrease energy so as to maintain a constant energy amount of a system for each moment (reference numeral 130 of FIG. 1), an energy storage technology is required to satisfy such a requirement.

An energy storage technology may represent a technology for improving the efficiency in use of energy generated by a power plant, instead of generating energy. The efficiency may represent a lower cost and a lower rate of energy discharge in terms of operation of a power system.

SUMMARY

Embodiments provide a method for efficiently operating a power system so that energy is stably transferred between a system and a battery.

In one embodiment, a method for controlling a charging amount of an energy storage device connected to a system according to a change in an operating frequency of the system by the energy storage device includes determining whether the operating frequency of the system falls within a dead band range corresponding to a preset frequency range, determining whether an SOC level indicating the charging amount of the energy storage device falls within a preset maintaining range, in a case where the operating frequency falls within the dead band range, and adjusting the SOC level so that the SOC level falls within the maintaining range in a case where the operating frequency of the system falls within the dead band range and the SOC level is outside the preset maintaining range, wherein the maintaining range represents a range between a preset lower limit and a preset upper limit, wherein the adjusting the SOC level includes performing different adjusting operations respectively for a case where the SOC level is smaller than the lower limit and a case where the SOC level is larger than the upper limit.

In another embodiment, a power management system includes a power conversion system which associates a generator, a battery, and a system with each other to supply power to a load, or receives DC power from the generator or the battery to convert the DC power and a charging control unit which reads SOC level information of the battery and monitors an SOC change amount due to charging or discharging of the battery, wherein the charging control unit reads a frequency of the system through the power conversion unit, determines whether the frequency of the system falls within a dead band range that is a preset frequency range, and adjusts the SOC level so that the SOC level falls within a preset maintaining range in a case where the frequency falls within the dead band range and the SOC level is outside the maintaining range.

According to a proposed embodiment, even if a system frequency is changed near an upper limit or a lower limit of a preset dead band, charging or discharging of a battery may be stably performed.

In this manner, the system frequency may be easily stabilized.

The details of one or more embodiments are set forth in the accompanying drawings and the description below. Other features will be apparent from the description and drawings, and from the claims.

DETAILED DESCRIPTION OF THE EMBODIMENTS

Figure 1:
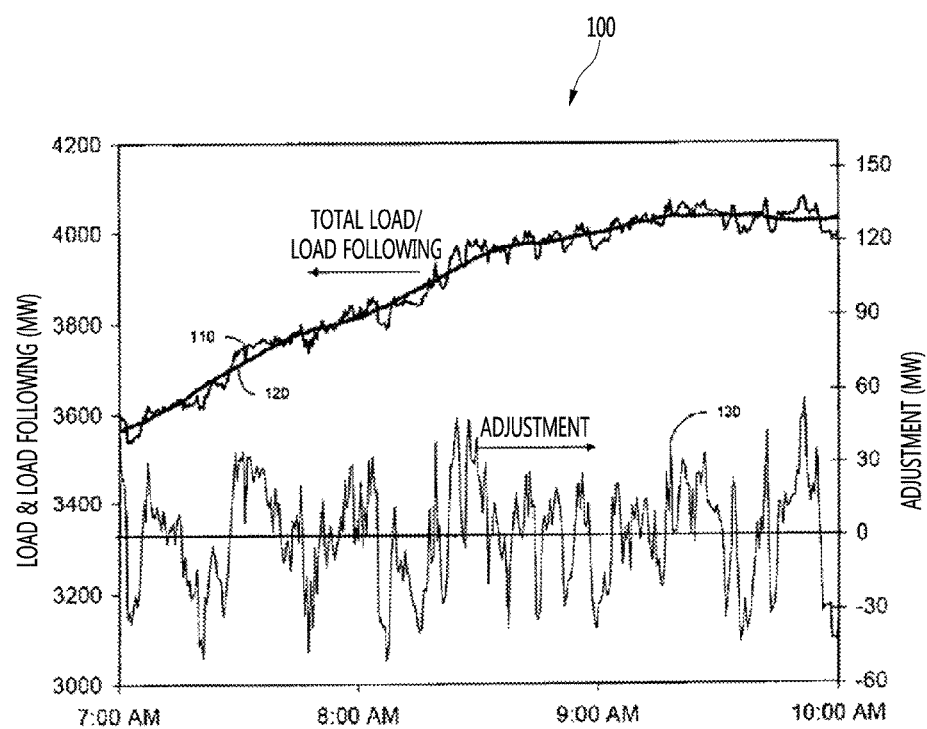
FIG. 1 is a diagram illustrating an actual load and load following of a power plant.

It should be understood that the terms used herein should not be construed as being limited to general or dictionary meanings, but should be interpreted based on the meanings and concepts corresponding to technical aspects of embodiments, considering that inventors may define terms appropriately to describe their inventions in the best ways.

Therefore, it should be understood that the embodiments described herein and the configurations illustrated in the drawings are merely preferred examples and do not entirely represent the technical aspects of the embodiments, and thus, various alternative equivalents or modifications could be made at the filing date.

Hereinafter, embodiments will be described in detail with reference to the accompanying drawings.

Figure 2:
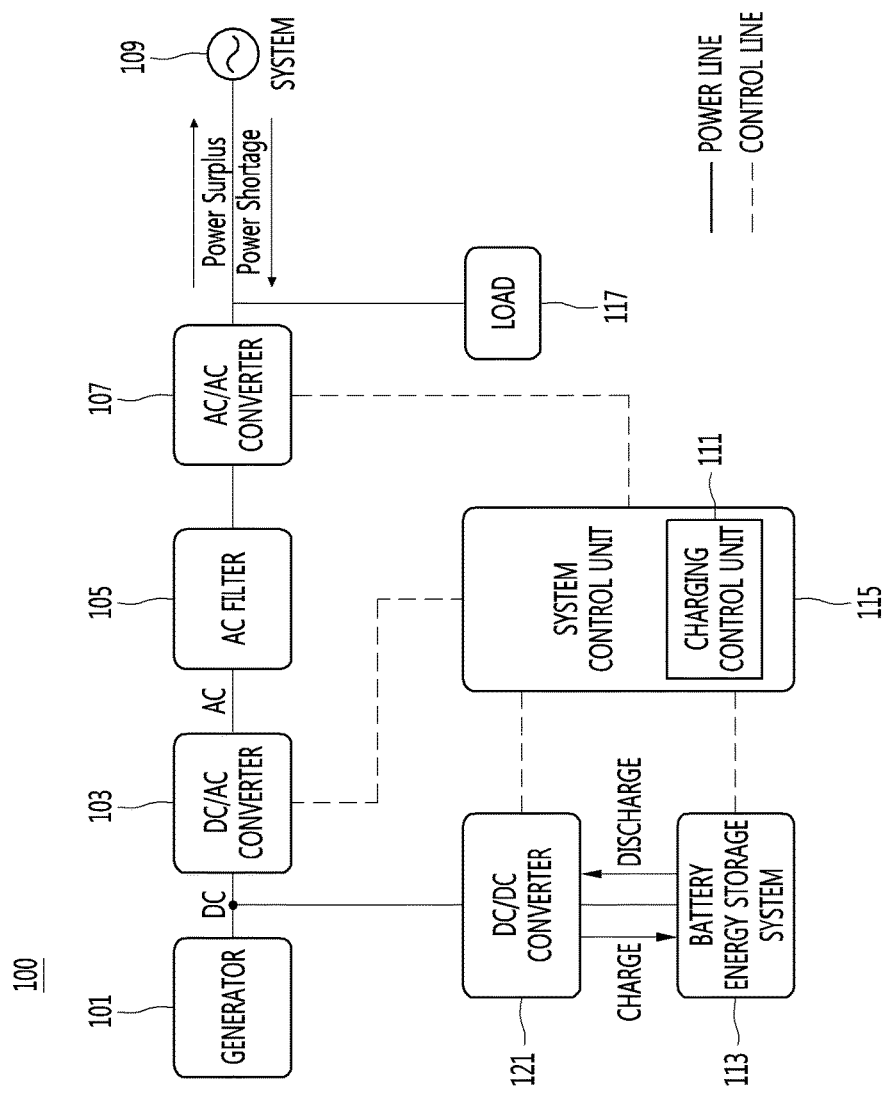
FIG. 2 is a diagram illustrating a configuration of a power management system according to an embodiment.

FIG. 2 is a block diagram illustrating a generated power management system according to an embodiment.

A power management system 100 according to an embodiment includes a generator 101, a DC/AC converter 103, an AC filter 105, an AC/AC converter 107, a system 109, a charging control unit 111, a battery energy storage system 113, a system control unit 115, a load 117, and a DC/DC converter 121.

The generator 101 generates electric energy. In the case where the generator is a photovoltaic power generator, the generator 101 may be a solar cell array. A plurality of solar cell modules are combined with each other in the solar cell array. The solar cell module is a device in which a plurality of solar cells are connected to each other in series or in parallel to generate a predetermined voltage or current by converting solar energy into electric energy. Accordingly, the solar cell array absorbs solar energy and converts the solar energy into electric energy. In the case where a generation system is a wind power generation system, the generator 101 may be a fan for converting wind power energy into electric energy. However, as described above, the power management system 100 may supply power only via the battery energy storage system 113 without the generator 101. In this case, the power management system 100 may not include the generator 101.

The DC/AC converter 103 converts DC power into AC power. The DC/AC converter 103 receives DC power supplied by the generator 101 or DC power discharged from the battery energy storage system 113 to convert the received power into AC power.

The AC filter 105 filters noise of the power converted into the AC power. According to a specific embodiment, the AC filter 105 may be omitted.

The AC/AC converter 107 converts a level of a voltage of the noise-filtered AC power so as to supply the power to the system 109 or the load 117. According to a specific embodiment, the AC/AC converter 107 may be omitted.

The system 109 represents a system in which a number of power plants, substations, transmission/distribution lines, and loads are integrated with each other so that the generation or use of power is performed therein.

The load 117 receives electric energy from the generation system and consumes power. The battery energy storage system 113 receives electric energy from the generator 101 so as to be charged, and discharges the charged electric energy according to power demand-supply conditions of the system 109 or the load 117.

In detail, in the case where the system 109 or the load 117 is lightly loaded, the battery energy storage system 113 receives idle power from the generator 101 so as to be charged. In the case where the system 109 or the load 117 is overloaded, the battery energy storage system 113 discharges the charged power to supply power to the system 109 or the load 117. The power demand-supply conditions of the system 109 or the load 117 may greatly vary with a time slot.

Therefore, it is inefficient for the power management system 100 to uniformly supply the power supplied by the generator 101 without considering the power demand-supply conditions of the system 109 or the load 117. Therefore, the power management system 100 controls the amount of power supply according to the power demand-supply conditions of the system 109 or the load 117, using the battery energy storage system 113. In this manner, the power management system 100 may efficiently supply power to the system or the load 117.

The DC/DC converter 121 converts a level of DC power supplied or received by the battery energy storage system 113. According to a specific embodiment, the DC/DC converter 121 may be omitted.

The system control unit 115 controls operation of the DC/AC converter 103 and the AC/AC converter 107. The system control unit 115 may include the charging control unit 111 for controlling charging or discharging of the battery energy storage system 113.

The charging control unit 111 controls charging or discharging of the battery energy storage system 113. In the case where the system 109 or the load 117 is overloaded, the charging control unit 111 controls the battery energy storage system 113 so that the battery energy storage system 110 supplies power and the power is transferred to the system 109 or the load 117. In the case where the system 109 or the load 117 is lightly loaded, the charging control unit 111 allows an external power supply source or the generator 101 to supply power so that the power is transferred to the battery energy storage system 113.

Meanwhile, a frequency of AC current supplied to a system is required to be constantly maintained. Here, during regulation of the frequency, a change such as an increase or decrease in an SOC of a battery may occur. For example, once the battery transfers a large amount of energy to the system, only a small amount of changed energy (about 20% SOC) remains in the battery. For another example, when the battery receives a large amount of energy from the system, the battery has a large amount of charged energy (about 85% SOC). In these two examples, the battery may deteriorate due to continuous regulation of a system frequency in the case where the charging amount or the discharging amount of the battery is large. To provide a more reliable system, battery charging is changed within a desired range in an embodiment.

According to an embodiment, an operation of increasing or decreasing a charging amount of a battery is performed, and such an operation is performed to achieve a suitable SOC according to an overall requirement of a power distribution system. In particular, proposed herein is a method for constantly maintaining an SOC level of a battery to suppress a variation of a system frequency so as to improve system stability by applying different frequency regulation algorithms according to the SOC level of the battery and an instantaneous system frequency value.

Figure 3:
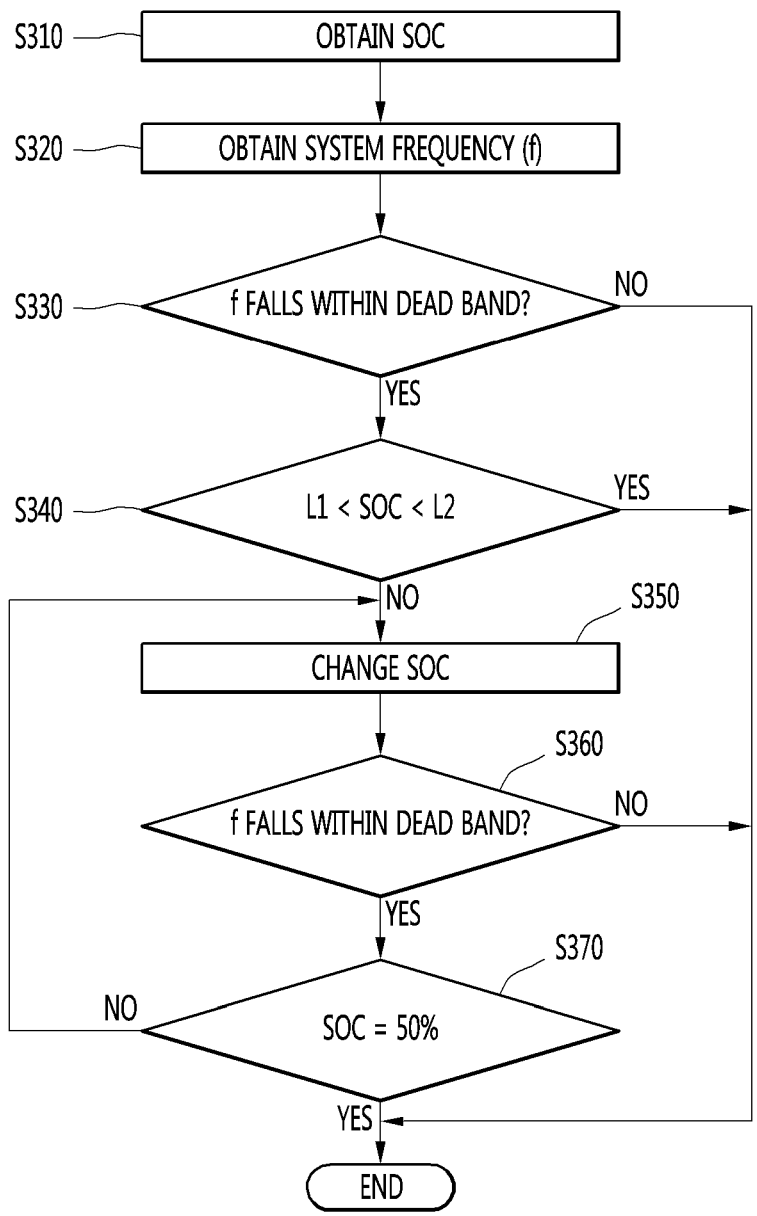
FIG. 3 is a flowchart illustrating a method for maintaining a specific range of charging in a battery according to an embodiment.

FIG. 3 is a flowchart illustrating a method for maintaining a specific range of charging in a battery according to an embodiment. According to this method, an operating frequency of an electric system is regulated while a system does not add or absorb power in order to provide frequency regulation.

The charging control unit 115 obtains a current SOC level (S310). For example, the charging control unit 115 may read the SOC level from the battery energy storage system 113, wherein the SOC level is a periodically monitored value.

The charging control unit 115 obtains a system frequency value (S320). For example, the charging control unit 115 obtains system frequency information measured from a power conversion unit 110. Furthermore, the charging control unit 115 determines whether a received frequency falls within a preset dead band (S330). For example, it is determined whether the received frequency falls within a range of 60 Hz±0.05 Hz that is the preset dead band. Such a range may represent a frequency range preset in a system to regulate a frequency. For example, the range of 60 Hz±0.05 Hz may be the preset dead band (or a reference frequency range), and a regulation request may be made only when an instantaneous system frequency is outside a set reference frequency range. In this case, a frequency of about 60 Hz may be a reference frequency. Furthermore, a frequency of about 60.05 Hz may be a maximum reference frequency, and a frequency of about 59.95 Hz may be a minimum reference frequency.

When the instantaneous system frequency does not fall within (or is outside) the dead band range, regulation of the SOC level is not performed. This is because energy transfer to the system when the frequency is high or energy transfer from the system when the frequency is low may cause necessity for the regulation. That is, when the system frequency is outside the dead band range, the regulation of the system frequency is automatically performed through energy transfer between the system and a battery.

However, when the system frequency falls within the dead band, the charging control unit 115 determines whether the SOC level falls within a range between a predetermined upper limit L2 and a predetermined lower limit L1 (S340). In an embodiment, L1 may be about 45% of a total battery capacity, and L2 may be about 55% of the total battery capacity.

In the case where the SOC level is outside a maintaining range (L1<SOC<L2) but the system frequency falls within the dead band, a procedure for adjusting the SOC level is performed (S350). The SOC level adjusting procedure will be described in more detail with reference to FIGS. 4 and 5. In an embodiment, in the case where the SOC level is smaller than the lower limit or is larger than the upper limit while the system frequency falls within the dead band, the SOC level adjusting procedure is performed, and, in particular, the adjusting procedure is performed according to respective adjusting graphs for the case where the current SOC level is smaller than the lower limit and the case where the current SOC level is larger than the upper limit.

Meanwhile, in the case where the SOC level falls within the maintaining range (dead band) (S330), energy transfer between the system and a battery cell is not performed.

Furthermore, while modification of the SOC level of the battery is performed, it is continuously monitored whether the system frequency is outside the dead band (S360). If the system frequency is outside the dead band, the system suspends charging or discharging of the battery. However, if the system frequency falls within the dead band, operation 370 for checking the SOC level is performed.

In operation 370, it is determined whether the SOC level returns to a target level (target value). For example, it is determined whether the SOC level falls again within the maintaining range of operation S330. According to an embodiment, the value may be modified, and this operation is performed until the SOC level becomes or approximates about 50%.

On the contrary, in the case where the SOC value approximates to the set upper limit or lower limit, charging modification is required to be performed repetitively. In the case where the SOC value does not fall within the maintaining range, operations 350 to 370 are repetitively performed. When the SOC value reaches a required value in operation 370, the system suspends a charging process.

In an embodiment, the charging control unit 115 may monitor the frequency of the system power via the inverter 130 or the power conversion unit 110, and may quickly determine when the system frequency falls within the preset dead band.

That is, once the system frequency falls within the dead band, the charging control unit 115 determines whether the SOC level of the battery is required to be modified.

The regulation of the system frequency and the adjustment of the SOC level of the battery cell are described below with reference to FIGS. 4 and 5.

Figure 4:
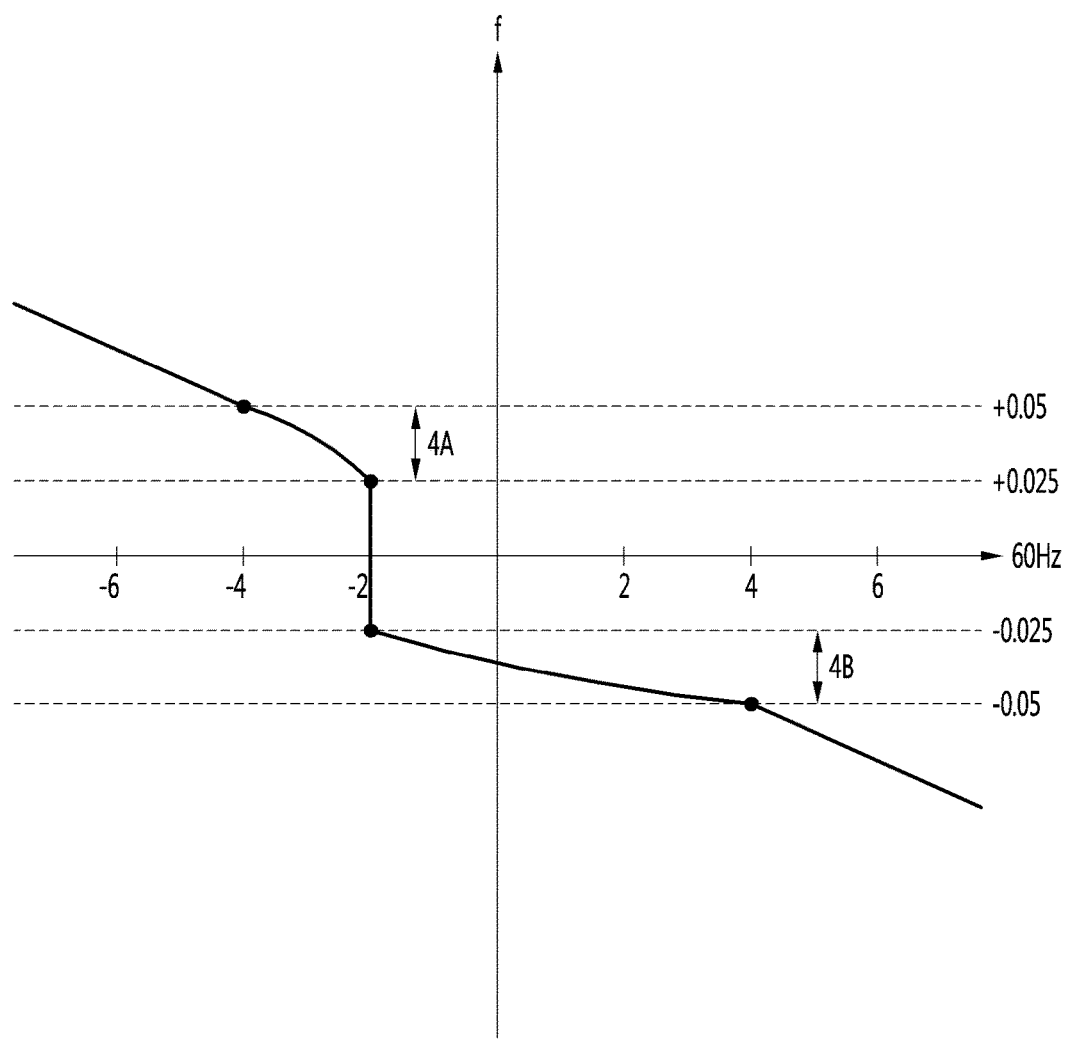
FIGS. 4 and 5 are adjustment graphs applied according to an SOC level according to an embodiment.
Figure 5:
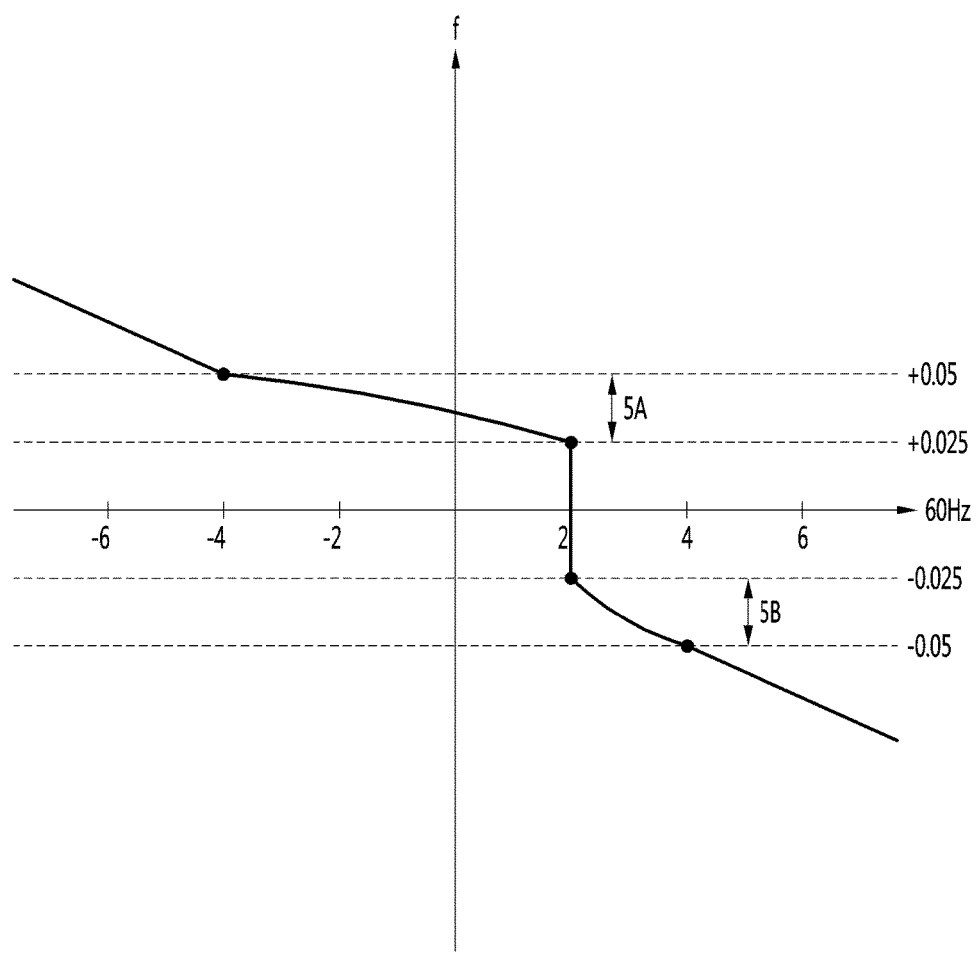

FIGS. 4 and 5 are adjustment graphs applied according to the SOC level according to an embodiment. In the case where the SOC level is outside the preset maintaining range and the instantaneous system frequency falls within the dead band, the adjustment graph of FIG. 4 or 5 is applied.

In the case where a measured SOC level is smaller than a lower limit (e.g., the SOC level is smaller than 45), the adjustment graph of FIG. 4 is applied, and this graph reflects an adjustment value to which a longer charging interval is applied to increase the SOC level.

FIGS. 4 and 5 are graphs for describing operation of the system for regulating the system frequency. The vertical axes represent a hertz (Hz) unit of the system frequency, and the horizontal axes represent a megawatt (MW) unit of the amount of energy transferred between the battery cell and the system.

Referring to FIG. 4, a frequency of 60 Hz is used as the reference system frequency, and an area between dotted lines represents an interval of the dead band (maintaining range) within which the system frequency is allowed to be changed without being regulated. In the example shown in FIG. 4, the dead band is set as 60 Hz±0.05 Hz.

Furthermore, in an embodiment, an upper limit inflection point and a lower limit inflection point are set within the dead band. For example, in the case where the reference frequency is 60 Hz and the dead band range is 60 Hz±0.05

Hz, the upper limit inflection point may be set at 60 Hz+0.025 Hz and the lower limit inflection point may be set at 60 Hz-0.025 Hz.

The upper limit inflection point and the lower limit inflection point are set so that charging or discharging of the battery is not rapidly changed in the case where the system frequency approximates to the upper limit or the lower limit of the dead band.

In the case where the system frequency falls within the dead band between the upper limit inflection point and the upper limit of the dead band, a state of the battery is gradually changed from a charging state to a discharging state along a hysteresis curve or is gradually changed from the discharging state to the charging state in order to prevent rapid switching between the charging state and the discharging state of the battery.

Likewise, in the case where the system frequency falls within the dead band between the lower limit inflection point and the lower limit of the dead band, the state of the battery is gradually changed from the discharging state to the charging state along the hysteresis curve or is gradually changed from the charging state to the discharging state.

As described above, in an embodiment, an upper limit inflection interval 4A is formed between the upper limit and the upper limit inflection point within the dead band, and a lower limit inflection interval 4B is formed between the lower limit and the lower limit inflection point if the dead band. In the inflection intervals, transition to the charging state or the discharging state of the battery may be gradually performed along the hysteresis curve.

Figure 6:
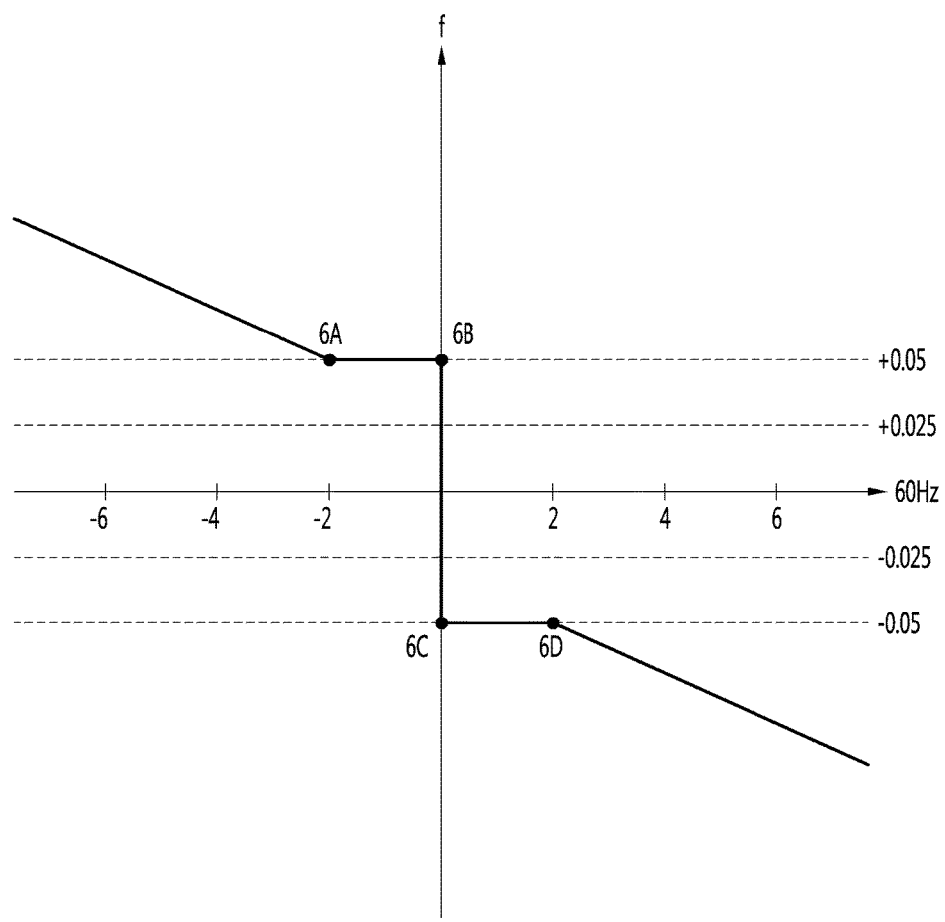
FIG. 6 is a graph to which a hysteresis curve is not applied for comparison with an adjustment graph of an embodiment.

In the case where charging of the battery is suddenly stopped in the charging state (6A, 6B) or discharging of the battery is suddenly stopped while power is supplied to the system through the discharging of the battery (6C, 6D) depending on whether the instantaneous system frequency falls within the dead band as illustrated in FIG. 6, the charging or discharging of the battery may be rapidly changed if the system frequency floats near the upper limit or the lower limit of the dead band.

In this case, the life of the battery may be shortened, and even the stability of the system frequency may be degraded.

Referring to FIG. 5, in the case where the measured SOC level is larger than the upper limit (e.g., the SOC level is larger than 55), the adjustment graph of FIG. 5 is applied, and this graph reflects an adjustment value to which a longer discharging interval (e.g., discharging to 2 MW) is applied to decrease the SOC level.

Referring to FIG. 5, a frequency of 60 Hz is used as the reference system frequency, and an area between dotted lines represents an interval of the dead band (maintaining range) within which the system frequency is allowed to be changed without being regulated. In the example shown in FIG. 5, the dead band is set as 60 Hz±0.05 Hz.

Furthermore, in an embodiment, an upper limit inflection point and a lower limit inflection point are set within the dead band. For example, in the case where the reference frequency is 60 Hz and the dead band range is 60 Hz±0.05 Hz, the upper limit inflection point may be set at 60 Hz+0.025 Hz and the lower limit inflection point may be set at 60 Hz-0.025 Hz.

In the case where the system frequency falls within the dead band between the upper limit inflection point and the upper limit of the dead band, the state of the battery is gradually changed from the charging state to the discharging state along a hysteresis curve or is gradually changed from the discharging state to the charging state in order to prevent rapid switching between the charging state and the discharging state of the battery.

Likewise, in the case where the system frequency falls within the dead band between the lower limit inflection point and the lower limit of the dead band, the state of the battery is gradually changed from the discharging state to the charging state along the hysteresis curve or is gradually changed from the charging state to the discharging state.

As described above, in an embodiment, an upper limit inflection interval 5A is formed between the upper limit and the upper limit inflection point within the dead band, and a lower limit inflection interval 5B is formed between the lower limit and the lower limit inflection point if the dead band. In the inflection intervals, transition to the charging state or the discharging state of the battery may be gradually performed along the hysteresis curve.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for controlling a charging amount of an energy storage device connected to a system according to a change in an operating frequency of the system by the energy storage device, the method comprising:
    determining whether the operating frequency of the system falls within a dead band range corresponding to a preset frequency range;
    determining whether an SOC level indicating the charging amount of the energy storage device falls within a preset maintaining range, in a case where the operating frequency falls within the dead band range; and
    adjusting the SOC level so that the SOC level falls within the maintaining range in a case where the operating frequency of the system falls within the dead band range and the SOC level is outside the preset maintaining range,
    wherein the maintaining range represents a range between a preset lower limit and a preset upper limit,
    wherein the adjusting the SOC level comprises performing different adjusting operations respectively for a case where the SOC level is smaller than the lower limit and a case where the SOC level is larger than the upper limit.

2. The method according to claim 1, wherein energy transfer is performed according to a hysteresis curve for gradual change of the energy transfer between the system and the energy storage device, with respect to a frequency falling within the dead band range.

3. The method according to claim 2,
    wherein the dead band is set as a range between a preset maximum reference frequency and a preset minimum reference frequency,
    wherein an upper limit inflection point having a lower value than that of the maximum reference frequency and a lower limit inflection point having a larger value than that of the minimum reference frequency are set within the dead band.

4. The method according to claim 3, wherein, in a case where the system frequency has a value between the maximum reference frequency and the upper limit inflection point, an amount of energy transferred from the system to the energy storage device follows the hysteresis curve.

5. The method according to claim 4, wherein, in a case where the system frequency has a value between the upper limit inflection point and the lower limit inflection point, an amount of energy transferred between the system and the energy storage device is constantly maintained regardless of a change in the system frequency.

6. The method according to claim 5, wherein, the amount of energy constantly transferred between the system and the energy storage device for the case where the SOC level is smaller than the lower limit differs from the amount of energy constantly transferred between the system and the energy storage device for the case where the SOC level is larger than the upper limit.

7. The method according to claim 3, wherein, in a case where the system frequency has a value between the minimum reference frequency and the lower limit inflection point, an amount of energy transferred from the energy storage device to the system follows the hysteresis curve.

8. The method according to claim 7, wherein, in a case where the system frequency has a value between the upper limit inflection point and the lower limit inflection point, the amount of energy transferred between the system and the energy storage device is constantly maintained regardless of a change in the system frequency.

9. A power management system comprising:
a power conversion system configured to associate a generator, a battery, and a system with each other to supply power to a load, or receive DC power from the generator or the battery to convert the DC power; and
a charging control unit configured to read SOC level information of the battery and monitor an SOC change amount according to charging or discharging of the battery,
wherein the charging control unit reads a frequency of the system through the power conversion unit, determines whether the frequency of the system falls within a dead band range that is a preset frequency range, and adjusts the SOC level so that the SOC level falls within a preset maintaining range in a case where the frequency falls within the dead band range and the SOC level is outside the maintaining range.

10. The power management system according to claim 9, wherein the charging control unit performs energy transfer according to a hysteresis curve for gradual change of the energy transfer between the system and the energy storage device, with respect to a frequency falling within the dead band range.

11. The power management system according to claim 10,
wherein the dead band is set as a range between a preset maximum reference frequency and a preset minimum reference frequency, and
wherein the charging control unit sets an upper limit inflection point having a lower value than that of the maximum reference frequency and a lower limit inflection point having a larger value than that of the minimum reference frequency within the dead band, and performs control differently for a case where the frequency of the system is between the upper limit inflection point and the maximum reference frequency and a case where the frequency of the system is between the lower limit inflection point and the minimum reference frequency.

12. The power management system according to claim 11, wherein, in a case where the system frequency has a value between the maximum reference frequency and the upper limit inflection point, the charging control unit performs control so that an amount of energy transferred from the system to the energy storage device follows the hysteresis curve.

13. The power management system according to claim 12, wherein, in a case where the system frequency has a value between the upper limit inflection point and the lower limit inflection point, the charging control unit constantly maintains an amount of energy transferred between the system and the energy storage device regardless of a change in the system frequency.

* * * * *